(12) United States Patent
Okamoto et al.

(10) Patent No.: US 12,181,946 B2
(45) Date of Patent: Dec. 31, 2024

(54) ABNORMALITY DETECTION CIRCUIT, SEMICONDUCTOR DEVICE, ELECTRONIC APPARATUS, AND VEHICLE

(71) Applicant: Rohm Co., Ltd., Kyoto (JP)

(72) Inventors: Keita Okamoto, Kyoto (JP); Shojiro Kato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 65 days.

(21) Appl. No.: 18/149,741

(22) Filed: Jan. 4, 2023

(65) Prior Publication Data

US 2023/0266810 A1 Aug. 24, 2023

(30) Foreign Application Priority Data

Feb. 21, 2022 (JP) ................ 2022-024941

(51) Int. Cl.
G06F 1/32 (2019.01)
G06F 1/3206 (2019.01)
G06F 1/3296 (2019.01)

(52) U.S. Cl.
CPC .......... G06F 1/3206 (2013.01); G06F 1/3296 (2013.01)

(58) Field of Classification Search
CPC ............................. G06F 1/3206; G06F 1/3296
See application file for complete search history.

(56) References Cited

U.S. PATENT DOCUMENTS 11,074,089 B2 * 7/2021 Ishida ................. G01R 21/006
2017/0357517 A1 * 12/2017 Ishida .................... H03K 17/18

FOREIGN PATENT DOCUMENTS

JP 2021-072740 5/2021
WO WO-2018047553 A1 * 3/2018 ............. B60R 16/02

* cited by examiner

*Primary Examiner* — Zahid Choudhury
(74) *Attorney, Agent, or Firm* — Fish & Richardson P.C.

(57) ABSTRACT

An abnormality detection circuit includes: a first current source configured to generate a first current flowing from an external terminal toward a reference potential terminal; a second current source configured to generate a second current flowing from a power supply potential terminal toward the external terminal; a comparator configured to generate an abnormality detection signal by comparing a detection voltage corresponding to an application voltage of the external terminal with a predetermined threshold voltage; and a controller configured to switch between a first abnormality detection mode in which an operation of generating the first current is performed and a second abnormality detection mode in which an operation of generating the second current is performed.

8 Claims, 10 Drawing Sheets

ABNORMALITY DETECTION CIRCUIT, SEMICONDUCTOR DEVICE, ELECTRONIC APPARATUS, AND VEHICLE

CROSS-REFERENCE TO RELATED APPLICATION

This application is based upon and claims the benefit of priority from Japanese Patent Application No. 2022-024941, filed on Feb. 21, 2022, the entire contents of which are incorporated herein by reference.

TECHNICAL FIELD

The present disclosure relates to an abnormality detection circuit, and a semiconductor device, an electronic apparatus, and a vehicle using the same.

BACKGROUND

In a switch device, an abnormality detection circuit is provided to detect an output abnormality state. Examples of the output abnormal state include a load open and an output ground fault or an output sky fault.

However, in a conventional abnormality detection circuit for detecting the load open and the output ground fault or the output sky fault, a detection circuit (a comparator, etc.) is required for each of the load open and the output ground fault or the output sky fault. Therefore, there is room for improvement in terms of circuit scale reduction.

SUMMARY

Abnormality detection circuit disclosed in the present disclosure includes: a first current source configured to generate a first current flowing from an external terminal toward a reference potential terminal; a second current source configured to generate a second current flowing from a power supply potential terminal toward the external terminal; a comparator configured to generate an abnormality detection signal by comparing a detection voltage corresponding to an application voltage of the external terminal with a predetermined threshold voltage; and a controller configured to switch between a first abnormality detection mode in which an operation of generating the first current is performed and a second abnormality detection mode in which an operation of generating the second current is performed.

A semiconductor device disclosed in the present disclosure includes the abnormality detection circuit having the above configuration.

An electronic apparatus disclosed in the present disclosure includes the semiconductor device having the above configuration.

A vehicle disclosed in the present disclosure includes the electronic apparatus having the above configuration.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Semiconductor Device (Low-Side Switch IC)>

Figure 1:
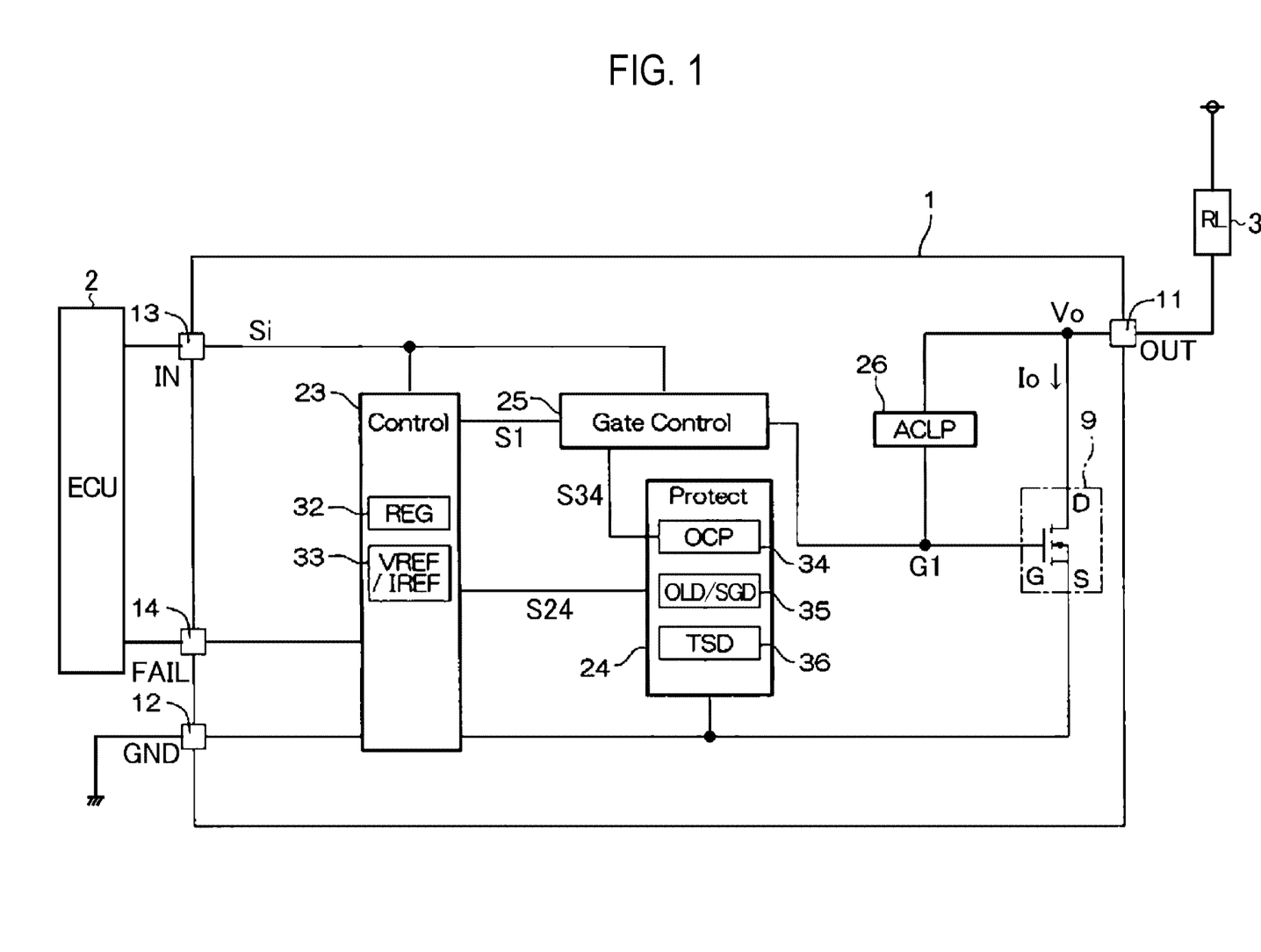
FIG. 1 is a diagram showing an overall configuration of a low-side switch IC.

FIG. 1 is a diagram showing an overall configuration of a low-side switch IC. A low-side switch IC 1 is an in-vehicle low-side switch LSI (a type of in-vehicle IPD) that electrically connects and disconnects between a load 3 and a reference potential terminal (for example, a ground terminal) according to instructions from an ECU [Electronic Control Unit] 2.

The low-side switch IC 1 has external terminals 11 to 14 as means for establishing electrical connection with the outside of a device. The external terminal 11 is a load connection terminal or an output terminal (OUT pin) for externally connecting the load 3 (a bulb lamp, a relay coil, a solenoid, a light emitting diode, a motor, etc.). The external terminal 12 is a GND terminal (GND pin) for connection with the reference potential terminal. The external terminal 13 is a signal input terminal (IN pin) for receiving an external input of an external control signal Si from the ECU 2. Although the external control signal Si is a logic signal for controlling ON/OFF of an NMOSFET 9, it can also be understood as a power supply voltage of the low-side switch IC 1. The external terminal 14 is a signal output terminal (FAIL pin) for externally outputting an output abnormality notification signal FAIL to the ECU 2.

The low-side switch IC 1 is formed by integrating the NMOSFET 9, a control logic 23, a protection circuit 24, a gate controller 25, and an active clamp circuit 26.

The NMOSFET 9 is a power transistor having a drain connected to the external terminal 11 and a source connected to the external terminal 12. The NMOSFET 9 connected in this manner functions as an output switch element (low-side switch element) for electrically connecting and disconnecting a current path from the load 3 to the ground terminal via the external terminals 11 and 12. The NMOSFET 9 is turned on when a gate drive signal G1 is at a high level, and is turned off when the gate drive signal G1 is at a low level.

The gate controller 25 performs an on/off control of the NMOSFET 9 by generating the gate drive signal G1 with increased current capability of a gate control signal S1 and outputting the gate drive signal G1 to a gate of the NMOSFET 9. The gate controller 25 has a function of controlling the NMOSFET 9 so as to limit an output current Io according to an overcurrent protection signal S34.

The control logic 23 generates the gate control signal S1 according to the external control signal Si. For example, when the external control signal Si is at a high level (a logic level for turning the NMOSFET 9 on), the control logic 23 is in an active state and the gate control signal S1 becomes a high level. On the other hand, when the external control signal Si is at a low level (a logic level for turning the NMOSFET 9 off), the control logic 23 is in an inactive state and the gate control signal S1 becomes a low level. The control logic 23 monitors various output signals of the protection circuit 24. In particular, the control logic 23 also has a function of generating the output abnormality notification signal FAIL according to the monitoring result of an output abnormality detection signal S24.

Referring to FIG. 1, the control logic 23 includes an internal power supply 32 and a reference voltage source/reference current source 33.

The internal power supply 32 generates a predetermined internal power supply voltage Vreg and supplies it to respective components (for example, the protection circuit 24) of the low-side switch IC 1. Further, whether or not the internal power supply 32 can operate is controlled according to the external control signal Si. More specifically, the internal power supply 32 is in an active state when the external control signal Si is at a high level, and is in an inactive state when the external control signal Si is at a low level.

The reference voltage source/reference current source 33 generates a reference voltage VREF and a reference current IREF for various circuits integrated in the low-side switch IC 1. The reference voltage VREF and the reference current IREF are input to, for example, the protection circuit 24. When the various circuits described above include comparators, the reference voltage VREF and the reference current IREF may be input to the comparators.

The protection circuit 24 is a circuit block that detects various abnormal states of the low-side switch IC 1, and includes an overcurrent protection circuit 34, an abnormality detection circuit 35, and a temperature protection circuit 36.

The overcurrent protection circuit 34 uses an overcurrent detection means (not shown) to generate the overcurrent protection signal S34 according to a monitoring result (whether or not an overcurrent abnormality of the output current Io has occurred). For example, the overcurrent protection signal S34 has a low level when an abnormality is not detected, and has a high level when an abnormality is detected.

The abnormality detection circuit 35 generates an abnormality detection signal S35 according to a detection result (whether or not a load open has occurred or whether or not an output ground fault has occurred). For example, the abnormality detection signal S35 has a low level when an abnormality is not detected, and has a high level when an abnormality is detected. The output ground fault refers to an abnormal state in which the external terminal 11 is short-circuited to the ground potential terminal (or a low potential terminal equivalent thereto).

The temperature protection circuit 36 includes a temperature detection element (not shown) that detects abnormal heat generation in the low-side switch IC 1 (particularly around the NMOSFET 9), and generates a temperature protection signal S36 according to a detection result (whether or not abnormal heat generation has occurred). For example, the temperature protection signal S36 has a low level when an abnormality is not detected, and has a high level when an abnormality is detected.

In addition, the overcurrent protection signal S34, the abnormality detection signal S35, and the temperature protection signal S36 may be configured to have a high level when an abnormality is not detected and to have a low level when an abnormality is detected.

The active clamp circuit 26 is connected between the external terminal 11 and the gate of the NMOSFET 9, and protects the NMOSFET 9 from a back electromotive force that may occur when the NMOSFET 9 is turned off. The active clamp circuit 26 may include a plurality of diodes forward-biased to one another. Further, the active clamp circuit 26 may also include a plurality of diodes backward-biased to one another. Alternatively, the active clamp circuit 26 may include a plurality of diodes forward-biased to one another and a plurality of diodes backward-biased to one another.

<Abnormality Detection Circuit (Example of Application to Low-Side Switch IC)>

Figure 2:
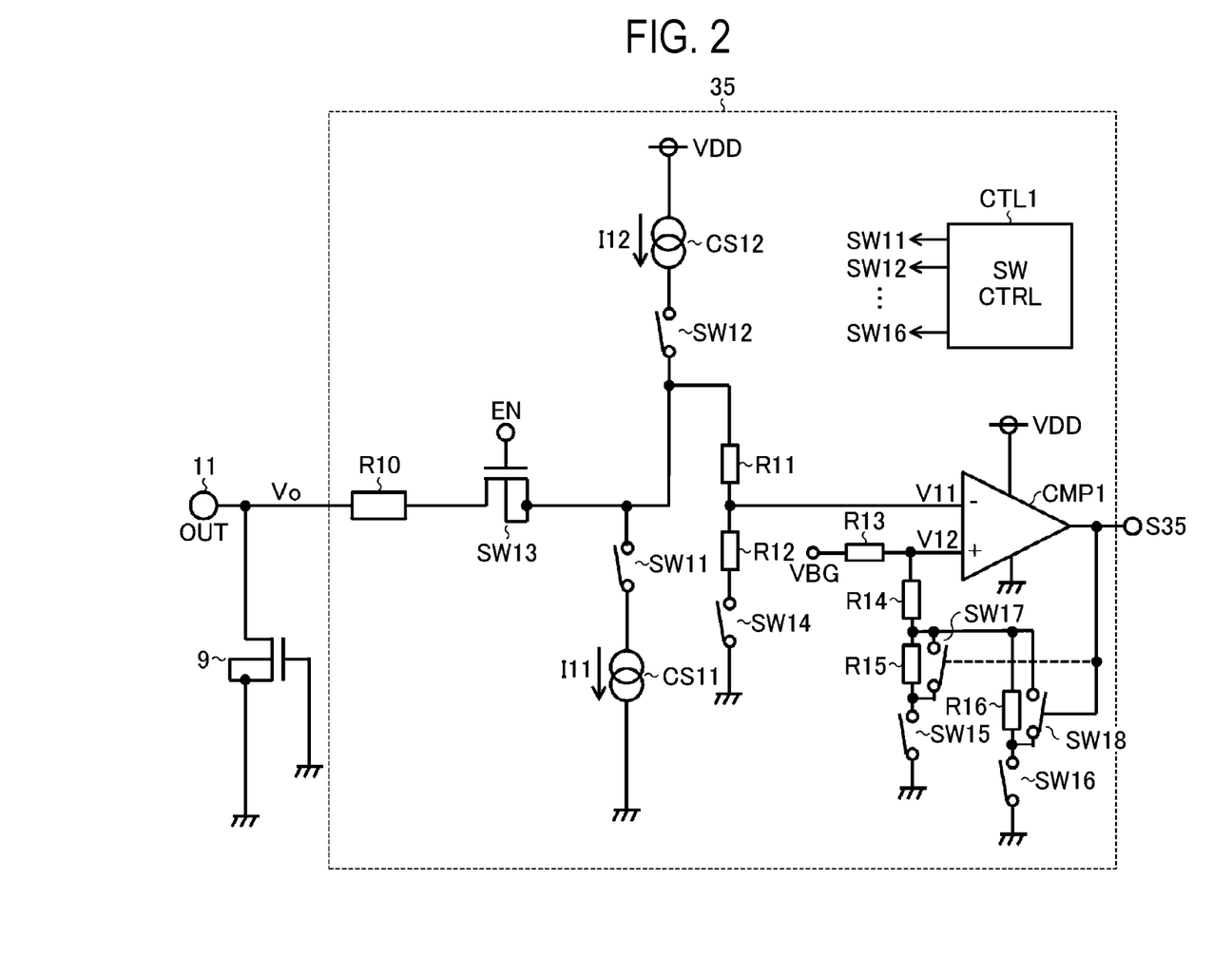
FIG. 2 is a diagram showing a configuration example of an abnormality detection circuit that can be applied to the low-side switch IC.

FIG. 2 is a diagram showing one configuration example of the abnormality detection circuit 35 that can be applied to the low-side switch IC 1. The abnormality detection circuit 35 of FIG. 2 includes a first current source CS11, a second current source CS12, a comparator CMP1, a controller CTL1, first to eighth switches SW11 to SW18, and resistors R10 to R16.

The external terminal 11 is connected to one end of the resistor R10. The other end of the resistor R10 is connected to the third switch SW13. The resistor R11, the second switch SW12, and the third switch SW13 are connected in parallel to one end of the first switch SW11. The first current source CS11 is connected to the other end of the first switch SW11. The first current source CS11 is connected between the first switch SW11 and the ground potential.

A power supply voltage VDD is applied to one end of the second current source CS12. The other end of the second current source CS12 is connected to the second switch SW12. The resistor R11 and an inverting input terminal of the comparator CMP1 are connected in parallel to one end of the resistor R12. The fourth switch SW14 is connected between the resistor R12 and the ground potential. The resistor R13 and a non-inverting input terminal of the comparator CMP1 are connected in parallel to one end of the resistor R14. The resistor R15, the seventh switch SW17, the resistor R16, and the eighth switch SW18 are connected in parallel to the other end of the resistor R14.

A reference voltage VBG is connected to one end of the resistor R13. The non-inverting input terminal of the comparator CMP1 and the resistor R14 are connected in parallel to the other end of the resistor R13. An output terminal of the comparator CMP1 is connected to an application terminal of the abnormality detection signal S35. The resistor R15 and the seventh switch SW17 are connected in parallel to one end of the fifth switch SW15. The ground potential is connected to the other end of the fifth switch SW15. The resistor R16 and the eighth switch SW18 are connected in parallel to one end of the sixth switch SW16. The ground potential is connected to the other end of the sixth switch SW16.

The first switch SW11 to the sixth switch SW16 are electrically connected and disconnected by control signals output from the controller CTL1. The seventh switch SW17 and the eighth switch SW18 are electrically connected and disconnected by the abnormality detection signal S35 output from the output terminal of the comparator CMP1. More specifically, when an abnormality such as a load open or an output ground fault is detected and the abnormality detection signal S35 is output at a high level, the seventh switch SW17 and the eighth switch SW18 are turned off.

The first current source CS11 is configured to draw a first current I11 from the external terminal 12 to the reference potential terminal. The second current source CS12 is configured to flow a second current I12 from the power supply potential terminal to the external terminal 12. The comparator CMP1 compares a detection voltage V11 corresponding to an application voltage Vo of the external terminal 12 with a predetermined threshold voltage V12, and generates the abnormality detection signal S35 according to the detection result.

The first switch SW11 is configured to electrically connect and disconnect between the first current source CS11 and the external terminal 11. The second switch SW12 is configured to electrically connect and disconnect between the second current source CS12 and the external terminal 11.

The controller CTL1 turns the first switch SW11 on and turns the second switch SW12 off in a first abnormality detection mode. The controller CTL1 is configured to turn the first switch SW11 off and turn the second switch SW12 on in a second abnormality detection mode.

The controller CTL1 performs a switching operation between the first abnormality detection mode and the second abnormality detection mode by switching the first switch SW11 and the second switch SW12. The third switch SW13 is configured to electrically connect and disconnect between the external terminal 11 and the first switch SW11 and between the external terminal 11 and the second switch SW12.

The fourth switch SW14 is configured to electrically connect and disconnect between the resistor R12 and the ground potential. The fifth switch SW15 is configured to electrically connect and disconnect between the resistor R15 and the ground potential and between the seventh switch SW17 and the ground potential. The sixth switch SW16 is configured to electrically connect and disconnect between the resistor R16 and the ground potential and between the eighth switch SW18 and the ground potential. The seventh switch SW17 is configured to electrically connect and disconnect between the resistor R14 and the fifth switch SW15, in other words, to switch whether or not to short-circuit across the resistor R15. The eighth switch SW18 is configured to electrically connect and disconnect between the resistor R14 and the sixth switch SW16, in other words, to switch whether or not to short-circuit across the resistor R16.

During the operation of the first abnormality detection mode, the first switch SW11, the third switch SW13, and the fifth switch SW15 are turned on by control signals from the controller CTL1. At this time, the second switch SW12, the fourth switch SW14, and the sixth switch SW16 are turned off. The seventh switch SW17 and the eighth switch SW18 are turned on by the abnormality detection signal S35 output from the output terminal of the comparator CMP1.

During the operation of the second abnormality detection mode, the second switch SW12, the third switch SW13, the fourth switch SW14, and the sixth switch SW16 are turned on by control signals from the controller CTL1. At this time, the first switch SW11 and the fifth switch SW15 are turned off. The seventh switch SW17 and the eighth switch SW18 are turned on by the abnormality detection signal S35 output from the output terminal of the comparator CMP1.

When the operations of the first abnormality detection mode and the second abnormality detection mode are not performed, the first switch SW11, the second switch SW12, the third switch SW13, the fourth switch SW14, the fifth switch SW15, and the sixth switch SW16 are all turned off.

The comparator CMP1 is configured to switch the threshold voltage V12 between the first abnormality detection mode and the second abnormality detection mode. The comparator CMP1 is configured to be commonly used during the operations of the first abnormality detection mode and the second abnormality detection mode by switching the first switch SW11, the second switch SW12, the third switch SW13, the fourth switch SW14, the fifth switch SW15, and the sixth switch SW16 using the control signals from the controller CTL1. With such a configuration, the number of elements can be reduced, thereby achieving miniaturization and cost reduction.

Figure 3:
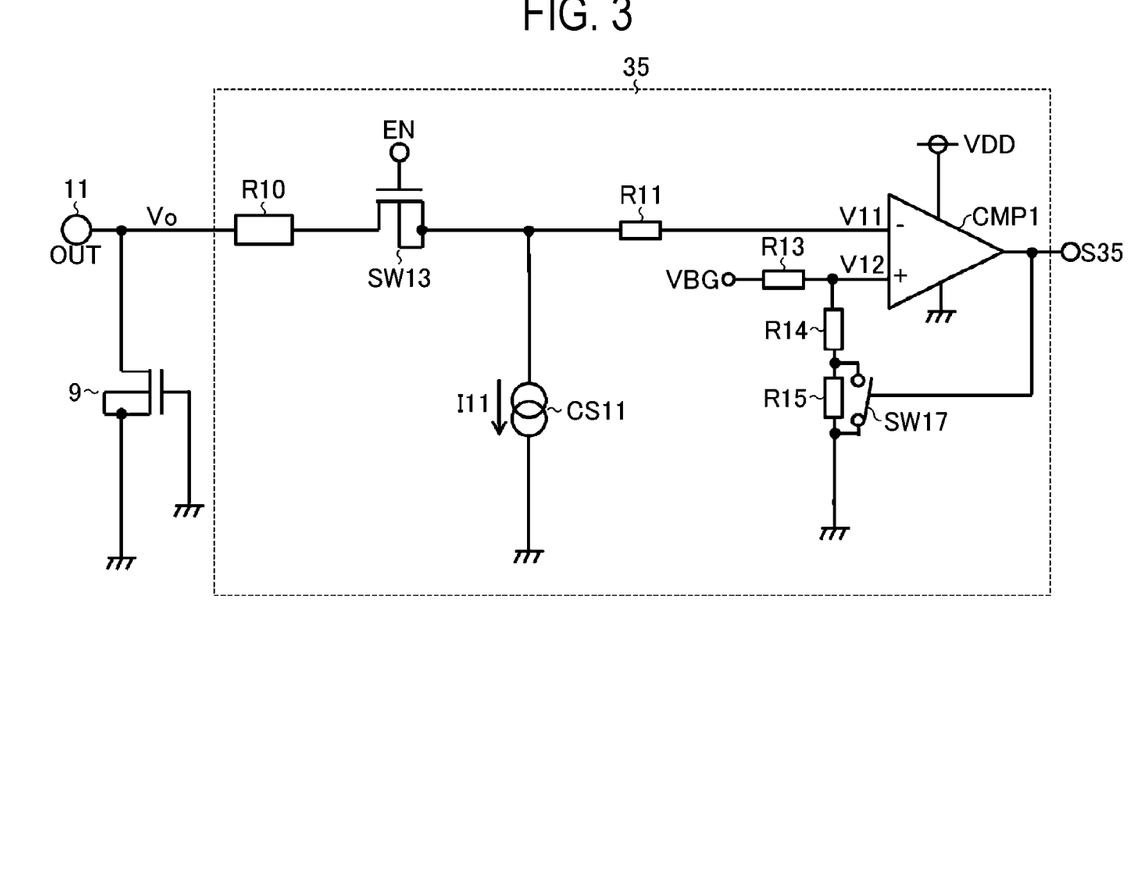
FIG. 3 is a diagram for explaining a first abnormality detection mode operation.

FIG. 3 is a diagram for explaining the first abnormality detection mode operation. In addition, the first switch SW11 and the fifth switch SW15, which are in the on state, are electrically connected, and are omitted in FIG. 3. During the first abnormality detection mode operation, the first switch SW11, the third switch SW13, and the fifth switch SW15 are turned on by control signals from the controller CTL1. The third switch SW13 is used as an enable switch. When the third switch SW13 is turned on, a detection operation of the first abnormality detection mode is started. The detection operation of the first abnormality detection mode diagnoses whether or not the load 3 is open.

When the third switch SW13 is turned on, a current is drawn from the external terminal 11 by the first current I11 generated from the first current source CS11. As a result, the first current I11 can flow from the external terminal 11 to the reference potential terminal. In a normal time when the load 3 is connected, the first current I11 is a current of several tens of μA. Thus, a voltage drop across the resistor R10 is small, and the detection voltage V11 corresponding to the application voltage Vo of the external terminal 11 does not become lower than the predetermined threshold voltage V12 at which the comparator CMP1 detects an abnormality.

When the load 3 is open, the application voltage Vo of the external terminal 11 decreases to an output level of the reference potential terminal by the first current source CS11. Since the detection voltage V11 corresponding to the application voltage Vo of the external terminal 11 is lower than the predetermined threshold voltage V12 at which the comparator CMP1 detects an abnormality, the abnormality can be detected. When the abnormality is detected, the output terminal of the comparator CMP1 outputs a high level, and the seventh switch SW17 is turned off. By turning the seventh switch SW17 off, the resistor R14 is connected to the fifth switch SW15 (accordingly the reference potential terminal) via the resistor R15. Therefore, the predetermined threshold voltage V12 at which the comparator CMP1 detects an abnormality becomes higher than before the abnormality is detected.

Figure 4:
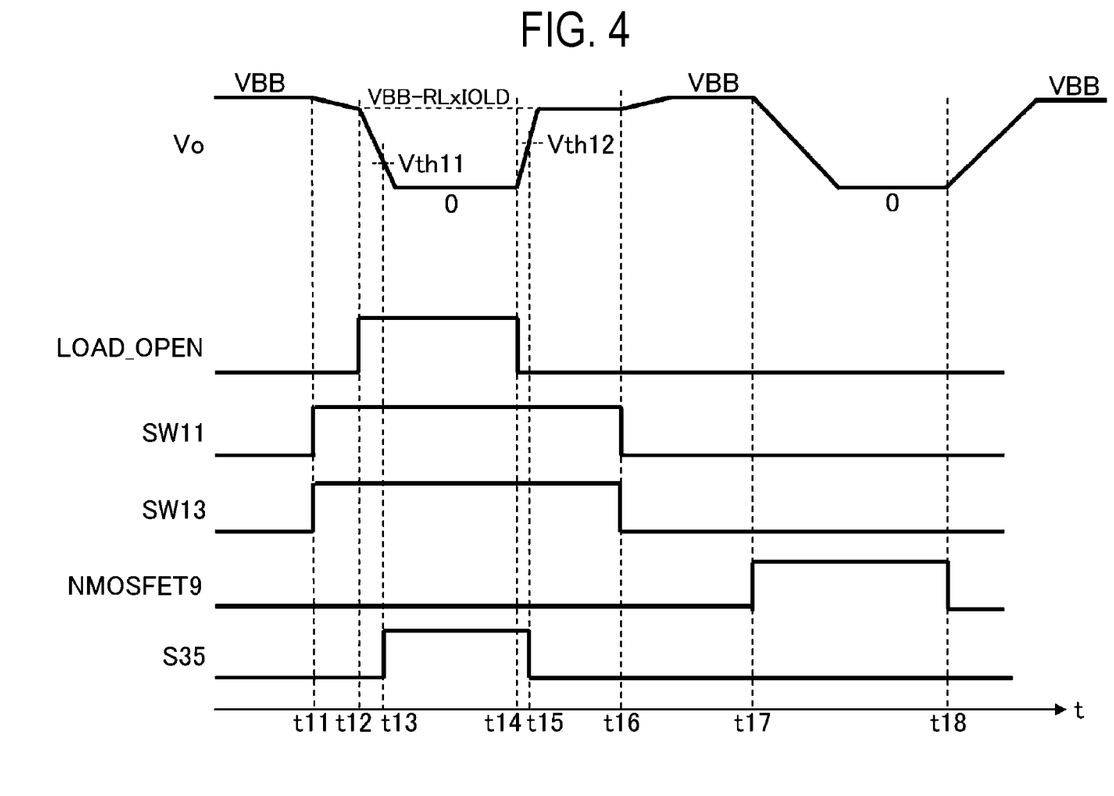
FIG. 4 is a diagram showing an application voltage of an external terminal during the first abnormality detection mode operation.

FIG. 4 is a diagram showing the application voltage Vo of the external terminal 12 during the first abnormality detection mode operation. At time t11, the first switch SW11 and the third switch SW13 are synchronously turned on, and the operation of the first abnormality detection mode is started. At this time, a current IOLD (=the first current I11) flows through the load 3 (impedance RL). As a result, the application voltage Vo drops from the power supply potential VBB by the voltage drop (RL×IOLD) across the load 3.

At time t12, when the load open (defined as LOAD_OPEN=H in FIG. 4) occurs, the application voltage Vo (accordingly the detection voltage V11) approaches the potential of the reference potential terminal and therefore starts to decrease. At time t13 when the detection voltage V11 becomes lower than the predetermined threshold voltage V12 (in FIG. 4, depicted as a detection threshold Vth11 for the application voltage Vo, for example, Vth11=2.10 V) at which the comparator CMP1 detects an abnormality, the abnormality is detected, and the abnormality detection signal S35 is output with a high level.

In reality, after the load open occurs, it is unlikely that the load open will normalize in the middle, but for the sake of convenience, assuming it will be normalized, the load open will normalize at time t14. As a result of the normalization, the application voltage Vo (accordingly the detection voltage V11) approaches the power supply potential VBB and therefore starts to increase. At time t15 when the detection voltage V11 becomes higher than the predetermined threshold voltage V12 (in FIG. 4, depicted as a release threshold Vth12 for the application voltage Vo, for example, Vth12=2.50 V) at which the comparator CMP1 detects an abnormality, the abnormality detection is released, and the abnormality detection signal S35 is output with a low level. At this time, the application voltage Vo returns to a potential lower than the power supply potential VBB by the voltage drop (RL×IOLD) across the load 3.

Thereafter, at time t16, the first switch SW11 and the third switch SW13 are synchronously turned off, and the operation of the first abnormality detection mode ends. In FIG. 4, since no abnormality is finally detected, the NMOSFET 9 is turned on from time t17 to time t18.

Figure 5:
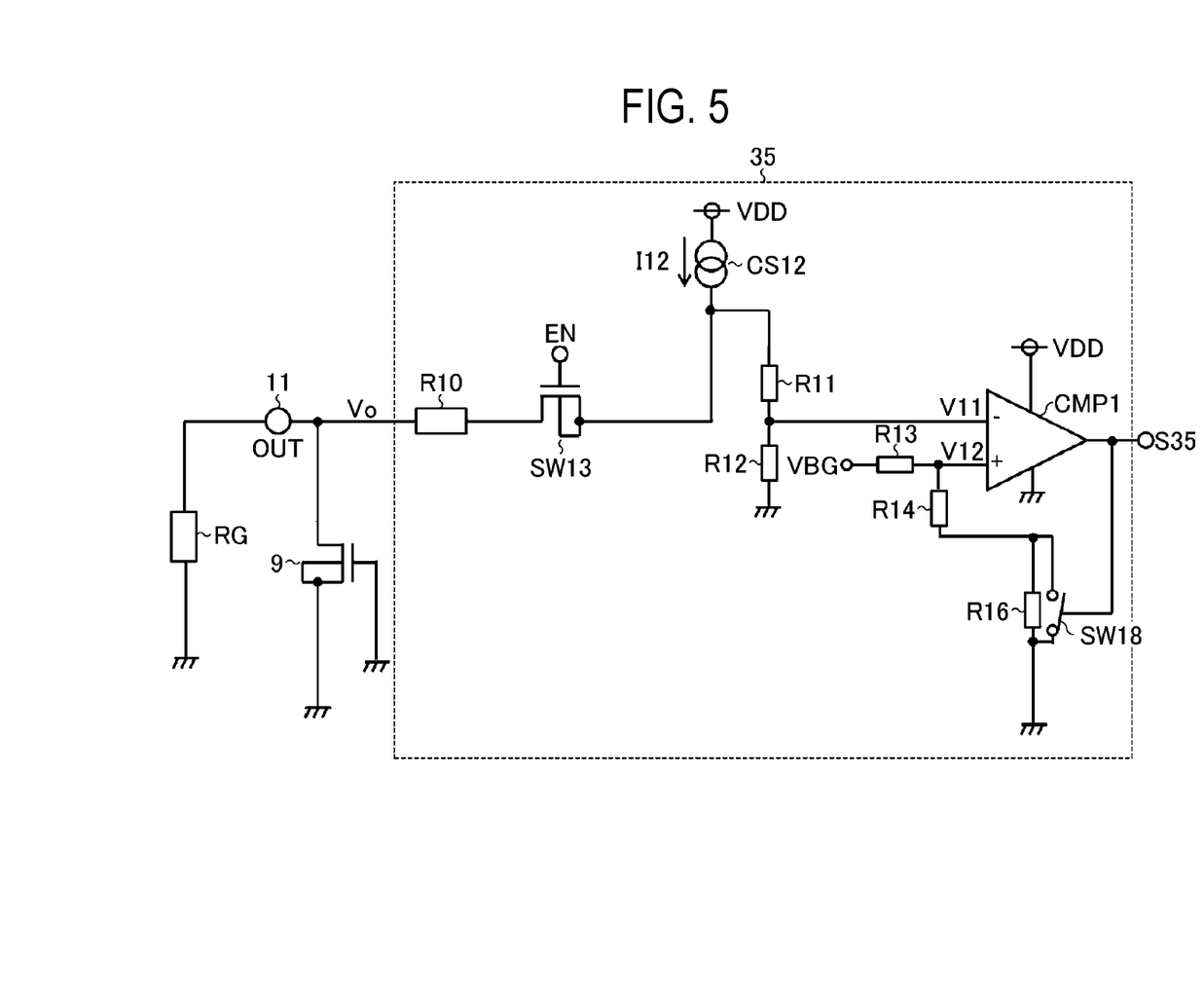
FIG. 5 is a diagram for explaining a second abnormality detection mode operation.

FIG. 5 is a diagram for explaining the second abnormality detection mode operation. In addition, the second switch SW12 and the sixth switch SW16, which are in the ON state, are electrically connected, and are omitted in FIG. 5. During the second abnormality detection mode operation, the second switch SW12, the third switch SW13, and the sixth switch SW16 are turned on by control signals from the controller CTL1. When the third switch SW13 is turned on, the detection operation of the second abnormality detection mode is started. The detection operation of the second abnormality detection mode diagnoses whether or not an output ground fault has occurred in the external terminal 11.

When the third switch SW13 is turned on, the second current I12 generated from the second current source CS12 flows from the power supply potential terminal toward the external terminal 11. When the load 3 is connected and an output ground fault occurs, the application voltage Vo of the external terminal 11 is determined by resistance voltage division of the impedance RL of the load 3 and an impedance RG between the external terminal 11 and the reference potential (that is, of an output ground fault path). An abnormality is detected when the detection voltage V11 corresponding to the application voltage Vo determined by the impedance RL of the load 3 and the impedance RG between the external terminal 11 and the reference potential becomes lower than the predetermined threshold voltage V12 at which the comparator CMP1 detects an abnormality.

When the load 3 is not connected and an output ground fault occurs, the application voltage Vo of the external terminal 12 drops to approximately the ground potential via the external terminal 11. As a result, the detection voltage V11 corresponding to the application voltage Vo of the external terminal 11 becomes lower than the predetermined threshold voltage V12 at which the comparator CMP1 detects an abnormality, and therefore the abnormality can be detected. When the abnormality is detected, the output terminal of the comparator CMP1 outputs a high level, and the eighth switch SW18 is turned off. When the eighth switch SW18 is turned off, the resistor R14 is connected to the sixth switch SW16 (accordingly the reference potential terminal) via the resistor R16. Therefore, the predetermined threshold voltage V12 at which the comparator CMP1 detects an abnormality becomes higher than before the abnormality is detected.

Figure 6:
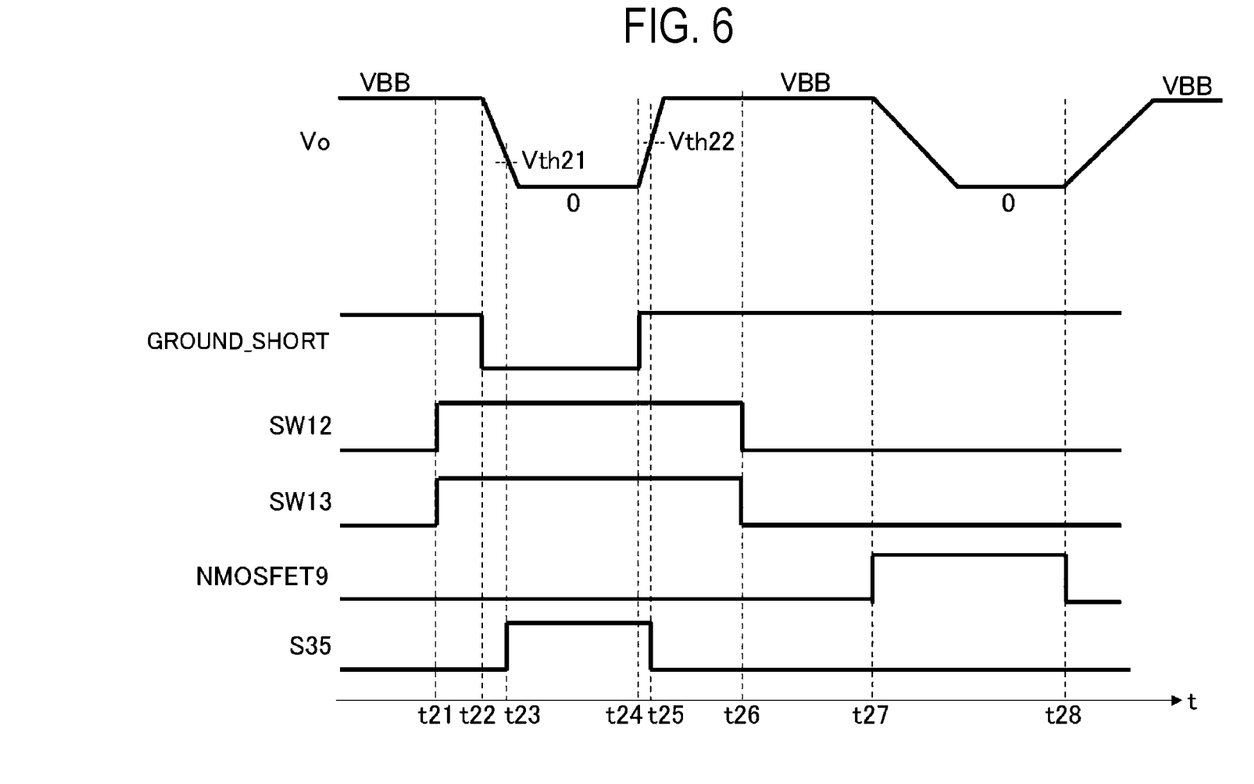
FIG. 6 is a diagram showing an application voltage of the external terminal during the second abnormality detection mode operation.

FIG. 6 is a diagram showing the application voltage Vo of the external terminal 12 during the second abnormality detection mode operation. At time t21, the second switch SW12 and the third switch SW13 are synchronously turned on, and the operation of the second abnormality detection mode is started. At time t22, when an output ground fault (defined as GROUND_SHORT=L in FIG. 6) occurs, the application voltage Vo (accordingly the detection voltage V11) drops to the potential of the reference potential terminal and therefore starts to decrease. At time t23 when the detection voltage V11 becomes lower than the predetermined threshold voltage V12 (in FIG. 6, depicted as a detection threshold Vth21 for the application voltage Vo, for example, Vth21=1.10 V) at which the comparator CMP1 detects an abnormality, the abnormality is detected, and the abnormality detection signal S35 is output with a high level.

In reality, after an output ground fault occurs, it is unlikely that the output ground fault will normalize in the middle, but for the sake of convenience, assuming it will be normalized, the output ground fault will normalize at time t24. As a result of the normalization, the application voltage Vo (accordingly the detection voltage V11) approaches the power supply potential VBB and therefore starts to increase. At time t25 when the detection voltage V11 becomes higher than the predetermined threshold voltage V12 (in FIG. 6, depicted as a release threshold Vth22 for the application voltage Vo, for example, Vth22=1.84 V) at which the comparator CMP1 detects an abnormality, the abnormality detection is released, and the abnormality detection signal S35 is output with a low level. Thereafter, at time t26, the second switch SW12 and the third switch SW13 are synchronously turned off, and the operation of the second abnormality detection mode ends. In FIG. 6, since no abnormality is finally detected, the NMOSFET 9 is turned on from time t27 to time t28.

Figure 7:
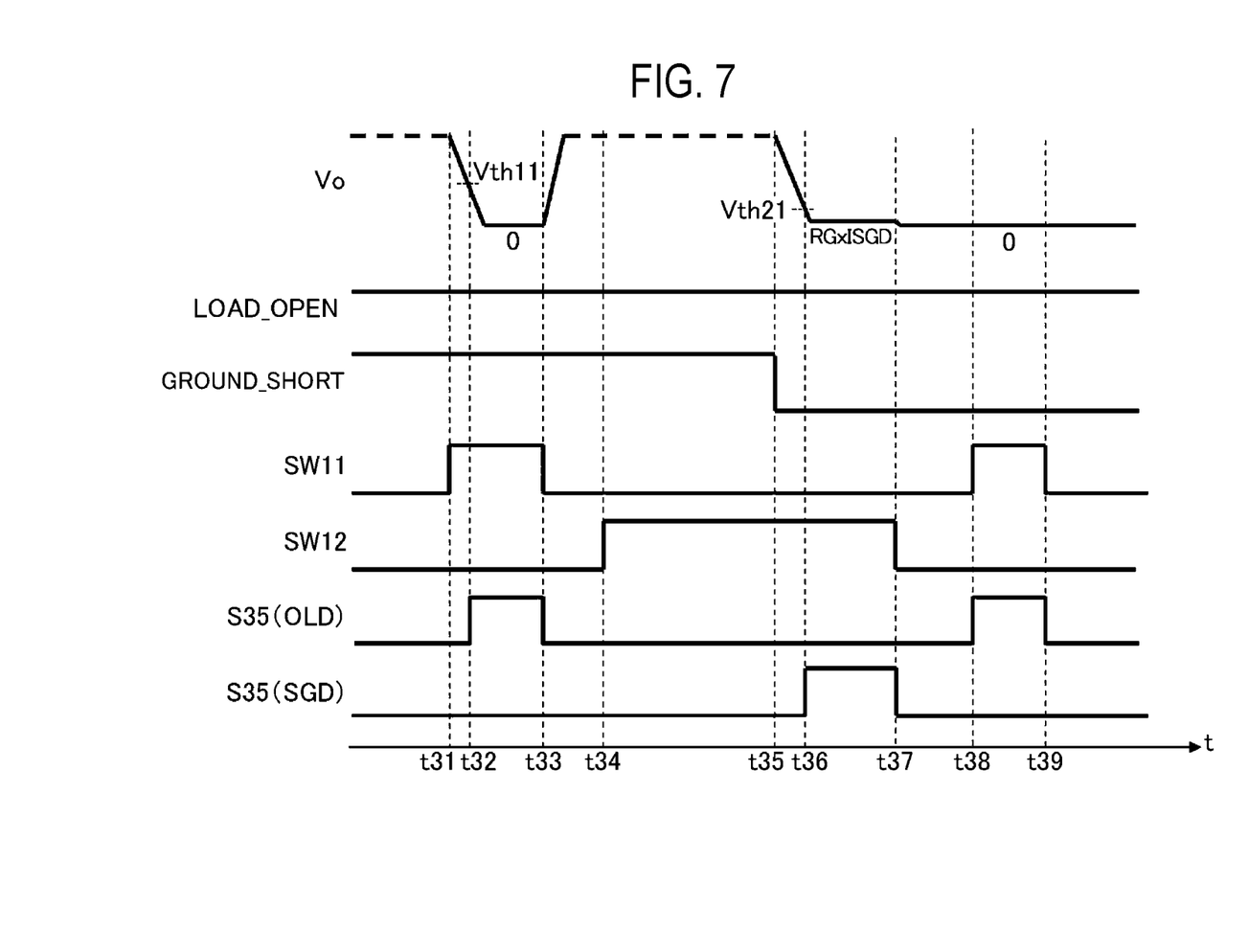
FIG. 7 is a diagram showing an application voltage of the external terminal during an abnormality detection operation in a load open state.

FIG. 7 is a diagram showing the application voltage Vo of the external terminal 12 during the abnormality detection operation in the load open state. Since the load open occurs, the application voltage Vo indicated by a broken line is an unstable voltage.

At time t31, the first switch SW11 is turned on, and the operation of the first abnormality detection mode is started. Since the load open (defined as LOAD_OPEN=H in FIG. 7) occurs, the application voltage Vo (accordingly the detection voltage V11) approaches the potential of the reference potential terminal and therefore starts to decrease.

At time t32 when the detection voltage V11 becomes lower than the predetermined threshold voltage V12 (in FIG. 7, depicted as a detection threshold Vth11 for the application voltage Vo, for example, Vth11=2.10 V) at which the comparator CMP1 detects an abnormality, the load open abnormality is detected, and the abnormality detection signal S35 (OLD) is output with a high level.

At time t33, the first switch SW11 is turned off, and the operation of the first abnormality detection mode ends. When the operation of the first abnormality detection mode ends, the abnormality detection is released, and the abnormality detection signal S35 (OLD) is output with a low level.

Thereafter, at time t34, the second switch SW12 is turned on, and the operation of the second abnormality detection mode is started. At time t35, when an output ground fault (defined as GROUND_SHORT=L in FIG. 7) occurs, the application voltage Vo (accordingly the detection voltage V11) approaches the potential of the reference potential terminal and therefore starts to decrease. At time t36 when the detection voltage V11 becomes lower than the predetermined threshold voltage V12 (in FIG. 7, depicted as a detection threshold Vth21 for the application voltage Vo, for example, Vth21=1.10 V) at which the comparator CMP1 detects an abnormality, the abnormality is detected, and the abnormality detection signal S35 (SGD) is output with a high level. At this time, the application voltage Vo drops to a potential higher than the potential of the reference potential terminal by RG×ISGD.

At time t37, the second switch SW12 is turned off, and the operation of the second abnormality detection mode ends. Since the operation of the second abnormality detection mode ends, the abnormality detection is released, and the abnormality detection signal S35 (SGD) is output with a low level. At this time, since an output ground fault occurs, the application voltage Vo is output with the voltage at the reference potential terminal.

Thereafter, at time t38, the first switch SW11 is turned on, and the operation of the first abnormality detection mode is started. Since the output ground fault occurs, the detection voltage V11 becomes lower than the predetermined threshold voltage V12 at which the comparator CMP1 detects an abnormality, and the abnormality detection signal S35 (OLD) is output with a high level at the same time as the first switch SW11 is turned on.

At time t39, the first switch SW11 is turned off, and the operation of the first abnormality detection mode ends. Since the operation of the first abnormality detection mode ends, the abnormality detection is released, and the abnormality detection signal S35 (OLD) is output with a low level.

As described above, when the load is in the open state, the abnormality detection signal S35 (OLD) has the high level during the operation of the first abnormality detection mode regardless of whether or not an output ground fault has occurred (see times t32 to t33 and times t38 to t39). That is, it is not possible to determine which abnormality of the load open state and the output ground fault has occurred only with the operation of the first abnormality detection mode. Thus, whether or not the output ground fault has occurred is determined by sequentially performing the operation of the first abnormality detection mode and the operation of the second abnormality detection mode.

As described above, the abnormality detection circuit disclosed in the present disclosure is configured to sequentially perform the abnormality detection operation in the first abnormality detection mode and the abnormality detection operation in the second abnormality detection mode, and turn the output switch element on when neither abnormality is detected. With such a configuration, it is possible to turn the output switch element on after checking to ensure that there is no abnormality, that is, neither the load is in an open state nor the output ground fault occurs.

Figure 8:
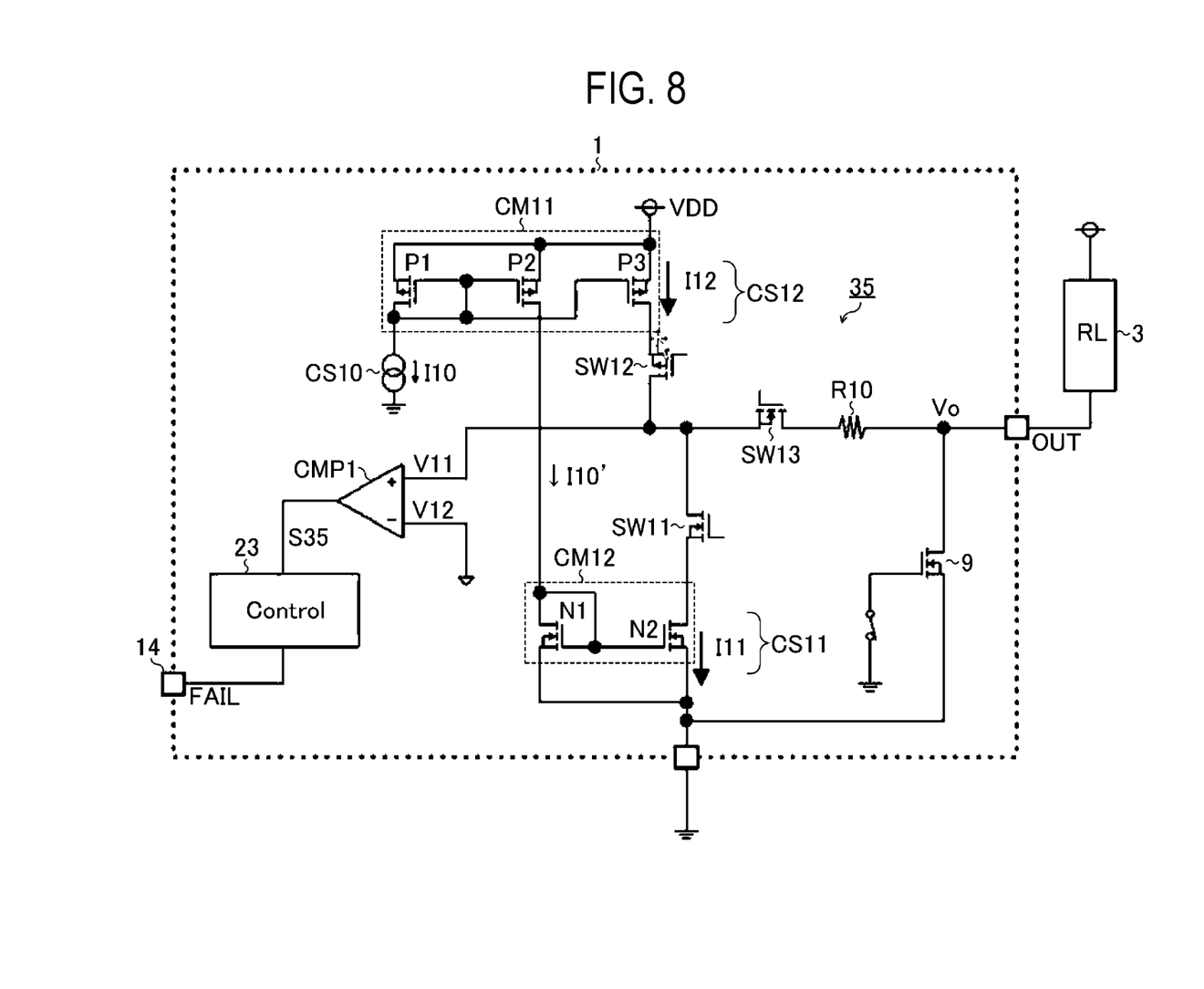
FIG. 8 is a diagram showing details of a configuration example of an abnormality detection circuit.

FIG. 8 is a diagram showing details of a configuration example of the abnormality detection circuit 35. The abnormality detection circuit 35 in FIG. 8 is configured to include current mirror circuits CM11 and CM12. The current mirror circuit CM11 includes transistors P1 to P3 (for example, PMOSFETs). The current mirror circuit CM12 includes transistors N1 and N2 (for example, NMOSFETs).

When the first current source CS11 generates the first current I11, control signals from the controller CTL1 turns the first switch SW11 on and turns the second switch SW12 off. The first current I11 generated by the first current source CS11 is generated by replicating a reference current I10, which is generated from a reference current source CS10, by the current mirror circuits CM11 and CM12.

Specifically, referring to FIG. 8, the first current I11 is generated by further replicating a mirror current I10' of the reference current I10, which is replicated by the current mirror circuit CM11, by the current mirror circuit CM12.

When the second current source CS12 generates the second current I12, control signals from the controller CTL1 turns the first switch SW11 off and turns the second switch SW12 on. The second current I12 generated by the second current source CS12 is generated by replicating the reference current I10, which is generated from the reference current source CS10, by the current mirror circuit CM11.

As described above, the first current I11 and the second current I12 can be respectively generated from the reference current I10 generated from the reference current source CS10 by switching the first switch SW11 and the second switch SW12.

<Abnormality Detection Circuit (Example of Application to High-Side Switch IC)>

Figure 9:
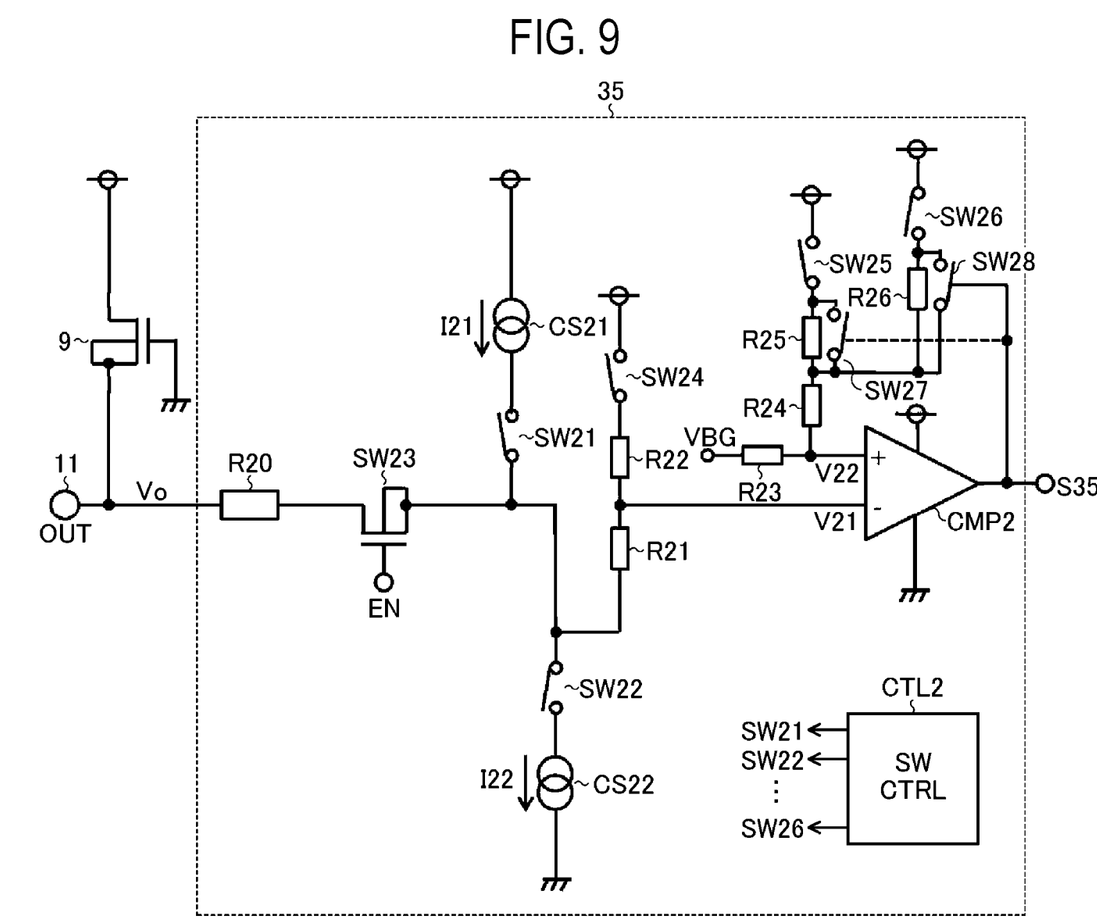
FIG. 9 is a diagram showing a configuration example of an abnormality detection circuit that can be applied to a high-side switch IC.

FIG. 9 is a diagram showing one configuration example of the abnormality detection circuit 35 that can be applied to the high-side switch IC. The abnormality detection circuit 35 of FIG. 9 includes a first current source CS21, a second current source CS22, a comparator CMP2, a controller CTL2, first to eighth switches SW21 to SW28, and resistors R20 to R26.

The controller CTL2 turns the first switch SW21 on and turns the second switch SW22 off in the first abnormality detection mode. The controller CTL2 is configured to turn the first switch SW21 off and turn the second switch SW22 on in the second abnormality detection mode.

The controller CTL2 switches the operations between the first abnormality detection mode and the second abnormality detection mode by switching the first switch SW21 and the second switch SW22.

The first to sixth switches SW21 to SW26 are electrically connected and disconnected by control signals output from the controller CTL2. The seventh switch SW27 and the eighth switch SW28 are electrically connected and disconnected by the abnormality detection signal S35 output from the output terminal of the comparator CMP2. More specifically, when an abnormality such as a load open or an output sky fault is detected and the abnormality detection signal S35 is output at a high level, the seventh switch SW27 and the eighth switch SW28 are turned off.

The abnormality detection circuit 35 of FIG. 9 is merely reversed in polarity, such as connecting the one connected to the ground of the abnormality detection circuit 35 of FIG. 2 to the power supply, and connecting the one connected to the power supply to the ground. Therefore, detailed explanation thereof will be omitted here.

The abnormality detection circuit 35 of this configuration example generates the abnormality detection signal S35 according to a detection result (whether or not a load open has occurred or whether or not an output sky fault has occurred). For example, the abnormality detection signal S35 has a low level when an abnormality is not detected, and has a high level when an abnormality is detected. The output sky fault refers to an abnormal state in which the external terminal 11 is short-circuited to the power supply potential terminal (or a high potential terminal equivalent thereto).

<Application to Vehicle>

Figure 10:
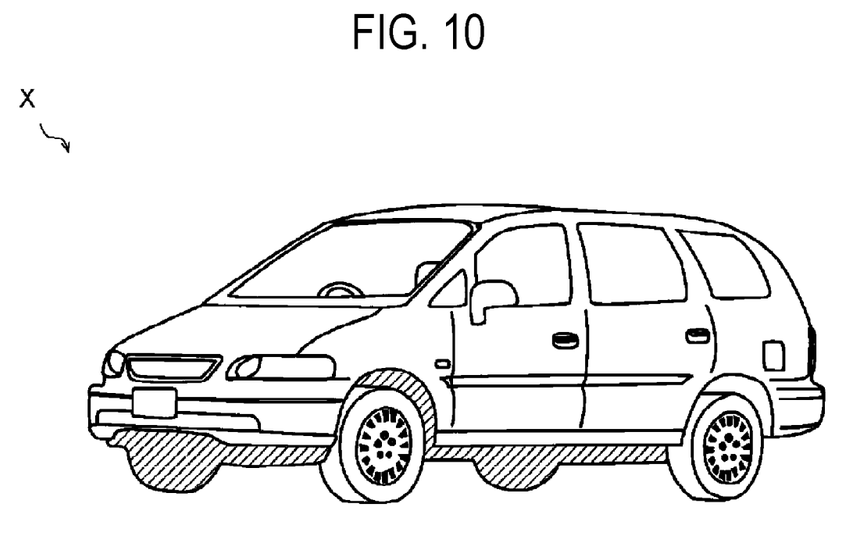
FIG. 10 is an external view showing a configuration example of a vehicle.

FIG. 10 is an external view showing one configuration example of a vehicle. A vehicle X of this configuration example is equipped with various electronic apparatuses that operate by being supplied with power from a battery.

The vehicle X includes not only an engine vehicle but also an electric vehicle (xEV such as BEV [Battery Electric Vehicle], HEV [Hybrid Electric Vehicle], PHEV/PHV [Plug-in Hybrid Electric Vehicle/Plug-in Hybrid Vehicle], or FCEV/FCV [Fuel Cell Electric Vehicle/Fuel Cell Vehicle]).

In addition, the low-side switch IC 1 described above can be incorporated in any of the electronic apparatuses equipped in the vehicle X.

SUMMARY

In the following, various embodiments disclosed in the present disclosure will be comprehensively described.

For example, an abnormality detection circuit disclosed in the present disclosure has a configuration (first configuration) that includes: a first current source configured to generate a first current flowing from an external terminal toward a reference potential terminal; a second current source configured to generate a second current flowing from a power supply potential terminal toward the external terminal; a comparator configured to generate an abnormality detection signal by comparing a detection voltage corresponding to an application voltage of the external terminal with a predetermined threshold voltage; and a controller configured to switch between a first abnormality detection mode in which an operation of generating the first current is performed and a second abnormality detection mode in which an operation of generating the second current is performed.

The abnormality detection circuit of the first configuration may have a configuration (second configuration) in which the threshold voltage is switched between the first abnormality detection mode and the second abnormality detection mode.

The abnormality detection circuit of the first or second configuration may have a configuration (third configuration) in which the abnormality detection circuit further includes a current mirror circuit configured to generate the first current and the second current from a common reference current.

The abnormality detection circuit of any one of the first to third configurations may have a configuration (fourth configuration) in which the abnormality detection circuit further includes: a first switch configured to electrically connect and disconnect between the first current source and the external terminal; and a second switch configured to electrically connect and disconnect between the second current source and the external terminal, wherein the controller is further configured to turn the first switch on and turn the second switch off in the first abnormality detection mode, and turn the first switch off and turn the second switch on in the second abnormality detection mode.

The abnormality detection circuit of the fourth configuration may have a configuration (fifth configuration) in which the abnormality detection circuit further includes a third switch configured to electrically connect and disconnect between the external terminal and the first switch and between the external terminal and the second switch.

Further, for example, a semiconductor device disclosed in the present disclosure has a configuration (sixth configuration) that includes: the external terminal; the abnormality detection circuit of the fifth configuration; and an output switch element configured to electrically connect and disconnect between the external terminal and the reference potential terminal or between the external terminal and the power supply potential terminal.

The semiconductor device of the sixth configuration may have a configuration (seventh configuration) in which the abnormality detection circuit is configured to sequentially perform an abnormality detection operation in the first abnormality detection mode and an abnormality detection operation in the second abnormality detection mode, and turn the output switch element on when no abnormality is detected.

Further, for example, an electronic apparatus disclosed in the present disclosure has a configuration (eighth configuration) that includes: the semiconductor device of the sixth or seventh configuration; and a load externally connected to the external terminal.

Further, for example, a vehicle disclosed in the present disclosure has a configuration (ninth configuration) that includes the electronic apparatus of the eighth configuration.

Other Modifications

In addition to the above-described embodiments, the configurations of the present disclosure can be modified in various ways without departing from the gist of the disclosure. It should be considered that the above-described embodiments are exemplary and are not restrictive in all respects, and the technical scope of the present disclosure is indicated by the claims, not by the description of the above-described embodiments, and should be understood to include all changes belonging to the meaning and scope equivalent to the claims.

According to the present disclosure in some embodiments, it is possible to provide an abnormality detection circuit that can realize miniaturization and cost reduction, and a semiconductor device, an electronic apparatus, and a vehicle including the same.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An abnormality detection circuit comprising:
  a first current source configured to generate a first current flowing from an external terminal toward a reference potential terminal;
  a second current source configured to generate a second current flowing from a power supply potential terminal toward the external terminal;
  a comparator configured to generate an abnormality detection signal by comparing a detection voltage corresponding to an application voltage of the external terminal with a predetermined threshold voltage;
  a first switch configured to electrically connect and disconnect between the first current source and the external terminal;

a second switch configured to electrically connect and disconnect between the second current source and the external terminal; and a controller configured to switch between a first abnormality detection mode in which an operation of generating the first current is performed and a second abnormality detection mode in which an operation of generating the second current is performed, wherein the controller is further configured to turn the first switch on and turn the second switch off in the first abnormality detection mode, and turn the first switch off and turn the second switch on in the second abnormality detection mode.

2. The abnormality detection circuit of claim 1, wherein the threshold voltage is switched between the first abnormality detection mode and the second abnormality detection mode.

3. The abnormality detection circuit of claim 1, further comprising a current mirror circuit configured to generate the first current and the second current from a common reference current.

4. The abnormality detection circuit of claim 1, further comprising a third switch configured to electrically connect and disconnect between the external terminal and the first switch and between the external terminal and the second switch.

5. A semiconductor device comprising:
the external terminal;
the abnormality detection circuit of claim 4; and
an output switch element configured to electrically connect and disconnect between the external terminal and the reference potential terminal or between the external terminal and the power supply potential terminal.

6. The semiconductor device of claim 5, wherein the abnormality detection circuit is configured to sequentially perform an abnormality detection operation in the first abnormality detection mode and an abnormality detection operation in the second abnormality detection mode, and turn the output switch element on when no abnormality is detected.

7. An electronic apparatus comprising:
the semiconductor device of claim 5; and
a load externally connected to the external terminal.

8. A vehicle comprising the electronic apparatus of claim 7.

* * * * *